United States Patent [19]

Yew et al.

[11] Patent Number: 5,753,559

[45] Date of Patent: May 19, 1998

[54] METHOD FOR GROWING HEMISPHERICAL GRAIN SILICON

[75] Inventors: Tri-Rung Yew, Hsin-Chu; Water Lur; Shih-Wei Sun, both of Taipei, all of Taiwan

[73] Assignee: United Microelectronics Corporation, Hsin-Chu, Taiwan

[21] Appl. No.: 727,919

[22] Filed: Oct. 9, 1996

Related U.S. Application Data

[60] Provisional application No. 60/010,071 Jan. 16, 1996.

[51] Int. Cl.$^6$ ........................................................ H01L 21/70
[52] U.S. Cl. ............................................ 438/398; 438/684
[58] Field of Search .......................... 437/233; 438/255, 438/398, 680, 684, 764

[56] References Cited

U.S. PATENT DOCUMENTS

| | | | |
|---|---|---|---|
| 3,900,597 | 8/1975 | Chruma et al. | 427/82 |
| 4,877,753 | 10/1989 | Freeman | 437/101 |
| 5,021,100 | 6/1991 | Ishihara et al. | 136/249 |
| 5,208,479 | 5/1993 | Mathews et al. | 257/534 |
| 5,278,091 | 1/1994 | Fazan et al. | 437/52 |
| 5,545,586 | 8/1996 | Koh | 437/89 |
| 5,554,566 | 9/1996 | Lur et al. | 437/193 |
| 5,583,062 | 12/1996 | Kapoor | 437/31 |
| 5,604,146 | 2/1997 | Tseng | 437/52 |

FOREIGN PATENT DOCUMENTS

| | | |
|---|---|---|
| 5315543 | 11/1993 | Japan. |
| 6204426 | 7/1994 | Japan. |

OTHER PUBLICATIONS

S. Wolf et al. Silicon Processing for the VLSI Era, vol. 1: Process Technology, pp. 166–168, 1986.

Watanabe et al. "Hemispherical Grained Silicon (HSG-Si) Formation on In–Situ Phosphorous Doped Amorphous–Si Using the Seeding Method", Extended Abstracts of the 1992 International Conference on Solid State Devices and Materials, Tsukuba, pp. 422–424, 1992.

Fazan, P. et al., "Electrical Characterization of Textured Interpoly Capacitors for Advanced Stacked DRAMs," IEDM, IEEE 1990, pp. 663–666.

Itoh, H. et al., "Two step Deposited Rugged Surface (TDRS) Storagenode and Self Aligned Bitline–Contact Penetrating Cellplate (SABPEC) for 64 Mb DRAM STC Cell," Oki Elec. Industry Co., VLSI R&D Center, pp. 9–10.

Rosato, J. et al., "Ultra–High Capacitance Nitride Films Utilizing Surface Passivation on Rugged Polysilicon," J. Electrochem. Soc., vol. 139, No. 12, Dec. 1992, pp. 3678–3682.

Sakai, A. et al., "Growth Kinetics of Si Hemispherical Grains on Clean Amorphous–Si Surfaces," J. Vac. Sci. Technol. A, American Vacuum Society, vol. 11, Nov./Dec. 1993, pp. 2950–2953.

Sakao, M. et al., "A Capacitor–Over–Bit–Line (COB) Cell with a Hemispherical–Grain Storage Node for 64Mb DRAMs," IEDM, IEEE 1990, pp. 655–658.

Shirai, H. et al., A 0.54μm$^2$ Self–Aligned, HSG Floating Gate Cell (SA HF Cell) for 256Mbit Flash Memories, Device Technology, NEC Corp., Nov. 1995.

(List continued on next page.)

*Primary Examiner*—Charles L. Bowers, Jr.
*Attorney, Agent, or Firm*—William H. Wright; Alan S. Raynes

[57] ABSTRACT

Hemispherical-grained silicon (HSG-Si) is grown on polysilicon by plasma deposition. A wider range of substrate deposition temperatures can be used in the plasma deposition of HSG-Si than can be maintained in the low pressure chemical vapor deposition (LPCVD) of HSG-Si. The plasma deposition of HSG-Si can be performed in an electron cyclotron resonance chemical vapor deposition (ECR-CVD) system at input power levels ranging from 100–1500 W, at total pressures between 5–60 mTorr, and at substrate temperatures ranging from 200°–500° C. A mixture of silane and hydrogen gases at a dilution ratio of silane within the silane and hydrogen gas mixture $H_2/(SiH_4+H_2)$ between about 70–99% may be used in the ECR-CVD system. The polysilicon surface is cleaned of native oxides prior to plasma deposition of HSG-Si.

22 Claims, 4 Drawing Sheets

OTHER PUBLICATIONS

Watanabe, H. et al., "*An Advanced Technique for Fabricating Hemispherical–Grained (HSG) Silicon Storage Electrodes,*" IEEE Transactions on Electron Devices, vol. 42, No. 2, Feb. 1995, pp. 295–300.

Watanabe, H. et al., "*Device Application and Structure Observation for Hemispherical–Grained Si,*" J. Appl. Physics, vol. 71, No. 7, Apr. 1992, pp. 3538–3543.

Watanabe, H. et al., "*Hemispherical Grained Si Formation on 'in–situ' Phosphorus Doped Amorphous–Si Electrode for 256Mb DRAM's Capacitor,*" IEEE Transactions on Electron Devices, vol. 42, No. 7, Jul. 1995, pp. 1247–1254.

METHOD FOR GROWING HEMISPHERICAL GRAIN SILICON

This application claims priority from provisional application Ser. No. 60/010,071, filed Jan. 16, 1996.

BACKGROUND OF THE INVENTION

1. Field of the Invention

The present invention relates to the formation of integrated circuit devices and, more particularly, to the formation of integrated circuit devices which incorporate conductors having textured surfaces.

2. Description of the Related Art

Historically, increasing the density of integrated circuit devices has been accomplished in part by decreasing the size of structures within the devices such as wiring lines and transistor gate widths and by decreasing the separation between the structures which make up the integrated circuit devices. Reducing the size of circuit structures is generally referred to as decreasing the "design rules" used for the manufacture of the integrated circuit device. For semiconductor memories of the dynamic random access type, i.e., "DRAMs," information is typically stored by varying the amount of charge stored within each capacitor of an array of capacitors formed on the surface of a semiconductor substrate. Most often, a single bit of binary information is stored at each capacitor by associating a discharged capacitor state with a logical zero and a charged capacitor state with a logical one. Each of the memory capacitors within a typical DRAM essentially has a parallel plate structure. The surface area of the plates of the memory capacitor determines the amount of charge that can be stored on the capacitor, given the fixed operating voltage of a typical memory device, the plate separation that can reliably be manufactured, and the dielectric constant of the capacitor dielectric typically used in the capacitors. Reducing the size of such a DRAM capacitor in accordance with reduced design rules reduces the surface area of the capacitor plates and therefore has the effect of reducing the amount of charge that can be stored on the memory capacitor.

The plates of memory capacitors typically must be larger than a minimum size to obtain reliable operation of the memory. For recent ultra large scale integration ("ULSI") DRAM designs, typical bit line capacitances, sense amplifier sensitivities and noise signals are such that further reductions in the amount of charge stored on the DRAM memory capacitors could prevent the information stored on the capacitor from reliably being read out. Because charge inevitably drains from memory capacitors, DRAMs require the periodic refreshing of the charge stored on the capacitors of the DRAM to ensure that the stored charge remains above the minimum detectable level. Further reductions in capacitor size require more frequent refresh operations for the DRAM, which are undesirable because at least portions of the DRAM are unavailable for the reading and writing of information during refresh operations.

To address the challenges of reduced design rules, DRAM designs have been proposed which incorporate capacitors having vertical extensions above the surface of the substrate (i.e., "stacked") or below the surface of the substrate (i.e., "trenched"). By adopting a more three-dimensional structure, such DRAM designs provide memory capacitors having larger capacitances but which consume less of the substrate surface area. Although stacked capacitor and trench capacitor designs involve more complicated structures which are more difficult to manufacture, these designs have been adopted with at least some success. Alternative, less expensive and more easily manufactured structures providing improved capacitance memory capacitors are nevertheless desirable. In addition, it is desirable to reduce the vertical extent of the storage capacitor to allow the production of more planar device structures. There additionally remains a need to further increase the capacitance of DRAM storage capacitors while decreasing the amount of surface area consumed by the DRAM storage capacitor on the surface of the semiconductor substrate.

One technique that has been proposed for increasing the capacitance obtained for a fixed substrate surface area is to use rugged or textured polysilicon as the bottom plate for the memory capacitor. The advantages of this technique are illustrated in part in FIG. 1, which shows in cross-section a portion of a DRAM having a memory capacitor with a lower plate electrode formed from textured polysilicon. The illustrated DRAM consists of a silicon substrate 10, field oxidation region 12, drain region 14 and source region 16. Word lines 18 typically act as the gates of transfer field effect transistors ("FETs") and bit line 20 contacts the heavily doped source region common to the two illustrated FETs. In such a DRAM structure, the memory capacitor is connected to the drain 14 of the transfer FET to store the charge which corresponds to the information stored in that memory cell. A layer of textured polysilicon is used as the lower electrode 22 for the capacitor, a thin dielectric layer 24 covers the surface of the lower electrode 22, and cell plate 26 is formed on the dielectric layer 24 to serve as the upper electrode for the capacitor. By using textured polysilicon as the lower electrode of the capacitor, the surface area of the capacitor is increased without extending the capacitor electrodes laterally, so that the illustrated structure has improved capacitance for a fixed surface area.

A comparison between the memory capacitors shown in partial cross-section in FIGS. 2 and 3 further illustrates the advantage of utilizing a textured polysilicon layer as the lower electrode of a memory capacitor. Like reference numerals are used in FIGS. 1–3 to identify the same or similar structures for ease in understanding this discussion. Referring to FIG. 2, the lower electrode 22 is formed in such a fashion that it has a textured surface. The thin dielectric layer 24 should be sufficiently thin so that the texture of the lower electrode 22 is reproduced on the surface of the dielectric layer 24 and the lower surface of the upper electrode 26 runs parallel to the surface of the lower electrode 22. Comparing FIG. 2 to the FIG. 3 planar capacitor structure consisting of lower electrode 22', dielectric layer 24' and upper electrode 26', it can be appreciated that the electrodes of the structure of FIGS. 1–2 have larger surface areas than do the electrodes 22' and 26' of the FIG. 3 planar structure. Capacitors utilizing the FIG. 2 structure have been observed to have capacitances approximately two times larger than corresponding FIG. 3 capacitors which occupy the same surface area on the substrate.

A variety of techniques have been used to produce textured polysilicon for use in semiconductor devices like the DRAM illustrated in FIGS. 1–2. Watanabe, et al., "Device Application and Structure Observation for Hemispherical-Grained Si," describes the formation of hemispherical-grained polycrystalline silicon ("HSG-Si", the term frequently used to refer to textured polysilicon) by low pressure chemical vapor deposition (LPCVD) from silane gas ($SiH_4$). The surface roughness or texture of the HSG-Si films was optimized so that the HSG-Si films could be used as plates of DRAM memory capacitors. Acceptable levels of surface texture, determined by the increased electrode surface area for fixed substrate area desirable for memory capacitors, were obtained for material deposited at a substrate temperature of 590° C. Substrate deposition temperatures of ten degrees higher or lower than 590° C. produced an unacceptable surface texture, that is, these conditions produced an undesirably flat surface which did not have appreciably larger surface area than conventional polysilicon. Capacitors made using a lower electrode of HSG-Si deposited using LPCVD onto a substrate maintained at a temperature of 590° C. exhibited a capacitance per unit substrate area approximately two times larger than similar capacitors made using HSG-Si lower electrodes deposited at substrate temperatures of either 580° C. or 600° C. Accordingly, while LPCVD at 590° C. produces HSG-Si having desirable surface texture characteristics for use as a DRAM storage capacitor, careful control of the deposition conditions is necessary to achieve the desired results.

Fazan, et al., "Electrical Characterization of Textured Interpoly Capacitors for Advanced Stacked DRAMs," describes an alternative process for forming a textured surface on a layer of doped polycrystalline silicon. Wet oxidation at 907° C. is used to grow an oxide film on the surface of a doped polysilicon layer and then the oxide film is etched to produce a textured surface on the polycrystalline silicon. Etching of the oxide layer grown on the polysilicon layer results in creation of a textured polysilicon surface due to the greater levels of oxidation that occurs along the grain boundaries of doped polysilicon layers coupled with the subsequent removal of the oxide from the polysilicon grain boundaries. The extent of surface roughness produced in this process directly relates to the size of the polysilicon grains, so that small grained films are required to produce desirable levels of surface texture. Accordingly, it is preferred in this technique to utilize thin polysilicon films, which tend to have smaller grain sizes than thicker polysilicon films. Such thin polysilicon films, however, often have undesirably high resistance and are not particularly strong. The technique described in the Kazan article has the further disadvantage of requiring oxidation and etching steps beyond the steps of depositing the polysilicon layer. It would be desirable to grow HSG-Si using a simpler technique that allowed the use of thicker layers of polysilicon as part of the electrode structure.

Another technique utilized for growing polysilicon proceeds by depositing a layer of amorphous silicon having a planar surface. The surface of the amorphous silicon layer is cleaned to remove the native oxide from the surface of the amorphous silicon, and then seed crystal sites (i.e., nucleation sites) are formed on the cleaned surface by molecular beam deposition. Subsequent annealing of the structure in an ultra-high vacuum environment causes crystallites to grow from the seed crystal positions, so that the amorphous silicon layer is converted into a layer of silicon having HSG-Si on its surface. An early report on this technique is the article by Sakai, et al., "Growth Kinetics of Si Hemispherical Grains on Clean Amorphous-Si Surfaces." This technique has the disadvantage of requiring ultra-high vacuum for the molecular beam deposition and the annealing steps. Typically, moving wafers in and out of such ultra-high vacuum environments takes more time than wafer transport through more conventional processing environments, and so the use of such ultra-high vacuum environments limits the applicability of this method. It would therefore be desirable to provide a method of manufacturing textured polysilicon which is more simply manufactured.

SUMMARY OF THE PREFERRED EMBODIMENTS

One aspect of the present invention provides a method of making a device comprising the steps of providing to a deposition system a substrate having an exposed surface of a conductor primarily comprising silicon, generating a plasma region within the deposition system, and providing at least one reactant gas comprising silicon to the deposition system so that ions comprising silicon are generated within the deposition system and are transported to the exposed surface. This process deposits a layer of HSG-Si on the exposed surface of the conductor primarily comprising silicon.

In another aspect, the present invention can be used to make a device by depositing a layer of polysilicon on or above a silicon substrate. A silicon substrate having an exposed surface on the layer of polysilicon substantially free of native oxides is provided to the deposition system. The silicon substrate is maintained at a temperature below about 590° C. At least one reactant gas comprising silicon is provided to the deposition system. The deposition system generates a plasma within the deposition system so that the at least one reactant gas is excited to provide ions comprising silicon to the deposition system. The ions comprising silicon are transported to the exposed surface of the layer of polysilicon and a layer of HSG-Si is deposited.

A different aspect of the present invention provides a method of making a device comprising the steps of depositing a layer of polysilicon on or above a silicon substrate and providing an exposed surface on the layer of polysilicon substantially free of native oxides to a deposition system. The silicon substrate is maintained at a temperature below about 590° C. and at least one reactant gas comprising silicon is provided to the deposition system to deposit a layer of HSG-Si on the surface of the polysilicon.

DESCRIPTION OF THE PREFERRED EMBODIMENTS

Figure 1:
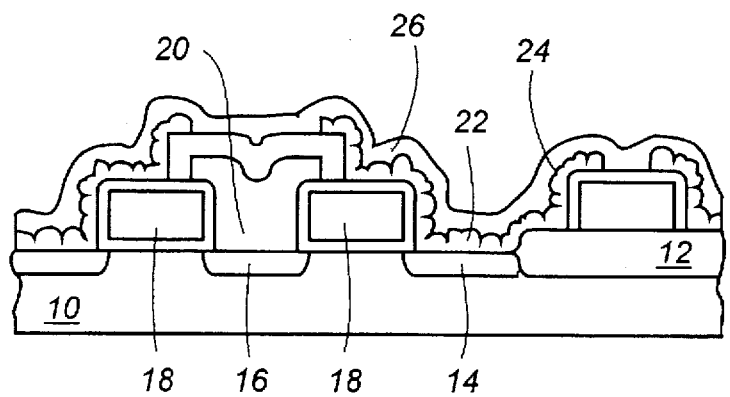
FIG. 1 illustrates in cross-section a portion of a DRAM utilizing a memory capacitor having a lower electrode incorporating a lower electrode of hemispherical grained silicon.
Figure 2:
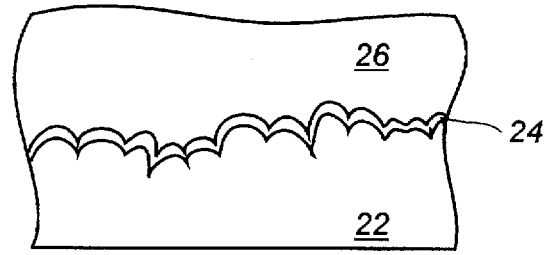
FIG. 2 illustrates an enlarged view of a portion of the FIG. 1 structure.
Figure 3:
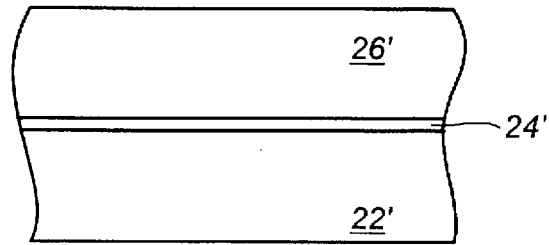
FIG. 3 illustrates for comparison a capacitor section similar to that illustrated in FIG. 2, but utilizing a planar capacitor structure.

Preferred embodiments of the present invention can be used to deposit layers of hemispherical grained polysilicon (HSG-Si) suitable for use in forming memory capacitors in DRAM structures such as that illustrated in FIG. 1. HSG-Si layers formed in accordance with the present invention can also be used in other semiconductor memory devices, or in other devices whose performance can be improved by providing increased capacitances without increasing the lateral extent of the capacitor. Particularly preferred embodiments of the present invention deposit HSG-Si from a gaseous mixture consisting of excited ions, such as a plasma. Deposition of polysilicon in accordance with preferred embodiments of the invention readily produces HSG-Si having desirable levels of surface texture over a broader range of processing conditions than can be used in the LPCVD deposition of HSG-Si. In addition, deposition of HSG-Si in accordance with preferred embodiments of the present invention can be performed as a simple modification of the conventional planar polysilicon deposition process, and so represents a less complicated process than either the process which includes the etching of doped polysilicon (Fazan, et al.), or the process which includes molecular beam deposition of seed crystals and subsequent annealing in an ultra-high vacuum environment.

Plasma deposition of HSG-Si in accordance with preferred embodiments of the present invention can be performed at a wider range of substrate deposition temperatures than can be used in the LPCVD deposition of HSG-Si. To deposit HSG-Si having the desired surface texture using LPCVD, it is necessary to maintain the substrate at the target deposition temperature to an accuracy of $\pm 3°$ C. By contrast, HSG-Si having desirable surface texture characteristics has, for example, been plasma deposited at substrate temperatures between 200° C. to 500° C. The more relaxed constraints on process variables provided using the methods of the present invention make the deposition of HSG-Si more reliable both in wafer uniformity and in wafer to wafer reproducibility. The significant benefits associated with the use of plasma deposition are believed to be related to the fact that plasma deposition generates many distinct nucleation sites from which silicon crystallites grow during the deposition process.

In the LPCVD deposition of HSG-Si, the very narrow range of substrate deposition temperatures reflects the limited range in which a sufficient level of nucleation and crystallite growth occurs without the occurrence of significant levels of surface reconstruction. Nucleation in the LPCVD process is believed to be primarily a thermal process, so that sufficiently high temperatures must be maintained for deposition to occur. On the other hand, temperatures only slightly higher than the target substrate temperature for LPCVD deposition of HSG-Si are sufficient to allow substantial levels of mobility for the silicon atoms at the growth surface, thereby allowing surface reconstruction during the LPCVD deposition of HSG-Si. Increasing the substrate deposition temperature by only a small amount above the minimum temperature for LPCVD growth results in the planarization of the surface, rather than in the growth of independent crystallites, due to the increased mobility of atoms during deposition. It is accordingly necessary to maintain the substrate temperature for LPCVD above the nucleation temperature but below the temperature where surface mobility significantly impedes the development of a textured surface. By contrast, in the plasma deposition of HSG-Si, the deposition substrate is preferably maintained at lower temperatures at which there is little mobility of silicon atoms at the deposition surface. Nucleation sites are generated at the deposition surface from the deposition gases in a manner that is relatively independent of the substrate temperature. Growth of HSG-Si crystallites appears to be controlled by the excitation of the reactant gases so that, for sufficiently high growth rates, crystallites grow independently over a broad range of substrate temperatures. Thus, plasma deposition of HSG-Si can be successfully performed at a wider range of substrate deposition temperatures as compared to the LPCVD of HSG-Si.

For definitional purposes, the LPCVD of HSG-Si can be viewed as a process that is primarily controlled by the thermal conditions of the deposition substrate, while plasma deposition is a process primarily controlled by the excitation level of the deposition gases.

Some of the literature on the LPCVD of HSG-Si emphasizes that the process should be performed on amorphous silicon surfaces because at least some investigators LPCVD believe that LPCVD on a polysilicon surface will more often result in the continued growth of crystallites existent on the surface of the polysilicon layer, rather than in the growth of a textured surface. HSG-Si can be formed by plasma deposition on polysilicon due to the nature of the nucleation process in plasma deposition. Use of polysilicon as the layer underlying the HSG-Si layer may be preferred for applications in which an HSG-Si surface is desirable, because polysilicon possesses superior conductivity characteristics as compared to amorphous silicon.

To facilitate the nucleation of seed crystallites in the initial phase of plasma deposition of HSG-Si, it is preferred that the growth process be initiated on a clean silicon surface. Typically, the growth process should be initiated on a polysilicon or amorphous silicon layer, which may be doped or undoped. Certain embodiments of the present invention utilize a layer of polycrystalline silicon deposited by LPCVD from silane at a temperature of about 620° C. Most preferably, the surface of the polycrystalline silicon layer is cleaned of native oxide before the HSG-Si plasma deposition process begins. A distinct cleaning step may be unnecessary if the growth of the HSG-Si layer is initiated immediately after forming the underlying layer of silicon, if the surface of the underlying silicon layer is maintained in a sufficient vacuum to prevent oxide growth. More practically, it is to be expected that there will be a time interval between the growth of the underlying silicon layer and the initiation of HSG-Si growth. Thus, a thin layer of native oxide will typically form on the surface of the underlying silicon layer. The presence of a thin layer of native oxide might hinder the nucleation of independent crystallite growth in the manner preferred for the present invention. Typically, though, growth of HSG-Si does occur, but there is an increase in the resistance between the HSG-Si layer and the underlying polysilicon or amorphous silicon layer. Accordingly, the surface of the underlying silicon layer is preferably cleaned before the initiation of HSG-Si growth to ensure lower resistance between the HSG-Si layer and the underlying conductive layer.

Native oxides may be cleaned from the surface of polysilicon or amorphous silicon by a variety of techniques, including HF dip, spin-etching using HF, vapor HF cleaning, or by an $H_2$ plasma cleaning. Preferably, the surface of the underlying silicon layer is hydrogenated as a result of the cleaning operation, because the hydrogenated surface serves to protect the polysilicon surface from reoxidation. Each of the cleaning techniques listed above will achieve the desired hydrogenation of the polysilicon surface.

After the surface of the underlying silicon layer has been prepared, HSG-Si is grown using a plasma deposition process. As used herein, the term "plasma deposition" refers to a variety of techniques that can be used for creating a gas of highly excited atomic or molecular species that, through any of a variety of deposition mechanisms, are deposited on a substrate. Well known and commonly practiced examples of such plasma deposition techniques include radio frequency (RF) sputtering, direct current (DC) sputtering, electron cyclotron resonance chemical vapor deposition (ECR-CVD), microwave chemical vapor deposition, and plasma enhanced chemical vapor deposition PECVD) or RF-CVD. Although testing of the various plasma deposition methods has not been undertaken, the present inventors believe that each of these techniques will provide acceptable results for the growth of HSG-Si. Deposition proceeds through the establishment of nucleation sites on the surface of the polysilicon or other desired deposition surface, and then the processing conditions such as substrate temperature and reactant flow rate are controlled so as to grow the silicon crystallites at a sufficient rate to prevent surface reconstruction during growth. The processing conditions for the growth of HSG-Si are chosen so as to emphasize the independent growth of crystallites at the growth surface of the polysilicon, thereby limiting the extent to which adjacent crystallites can grow together. To a certain extent, the particular process conditions that are optimum for the growth of HSG-Si will be determined by the particular system used for deposition, as is well know in the art of plasma deposition.

Figure 4:
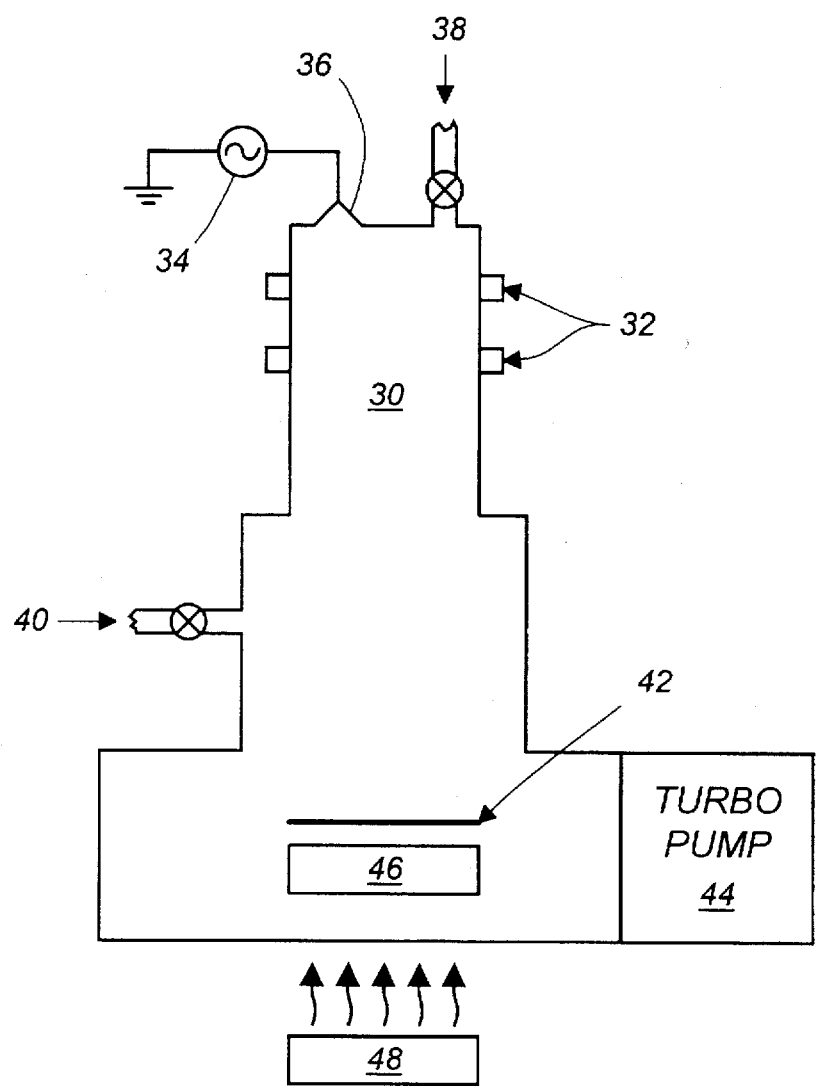
FIG. 4 illustrates a electron cyclotron resonance chemical vapor deposition system which may be used for the plasma deposition of textured polysilicon.

In certain preferred embodiments of the present invention, an ECR-CVD system such as that illustrated in FIG. 4 is used for the deposition of HSG-Si. An ECR-CVD deposition system provides the advantages of highly efficient excitation of reactants without the generation of high energy ions which can damage the substrate or the material being deposited. Microwave energy is generated by power supply 34 and may be provided to the system through an antenna 36 mounted so as to direct energy through the excitation region 30. Input power levels between 100–1500 W were used for successfully depositing HSG-Si films having desired levels of surface roughness. Magnetic coils 32 are situated around the excitation region 30 to generate the magnetic field necessary to establish the ECR condition within the excitation region 30. For microwaves supplied to the excitation region at a frequency of 2.45 GHz, the conditions for cyclotron resonance are satisfied by the presence of a magnetic field of approximately 875 Gauss. Typically, the magnetic coils 32 have a quadrupole or octopole configuration so that the appropriate magnetic field is generated over a limited region, and the field drops off quickly outside of that region. Thus, reactant excitation is primarily localized within a small region displaced away from the deposition substrate 42.

Reactant gases are input to the ECR-CVD system either at an inlet 38 upstream from the excitation region 30 or at an inlet 40 downstream from the excitation region. For the deposition of HSG-Si, a suitable input gas configuration is to input hydrogen gas ($H_2$) at the upstream gas inlet 38 and input a mixture of 5% silane ($SiH_4$) and 95% argon (Ar) at the downstream gas inlet 40. Turbomolecular pump 44 draws gas from the system, creating a gas flow from the gas inlets 38, 40 past the deposition substrate 42. Gas pressure can be varied within the range of between 5–60 mTorr, without affecting the quality of HSG-Si films deposited. Hydrogen flows from inlet 42 through the excitation region 30 where the hydrogen is highly ionized. Silane input at the downstream inlet 40 interacts with the excited hydrogen ions and with the input microwave radiation, so that the silane is excited and ionized. The silicon ions interact with and are deposited on the surface of the deposition substrate 42.

The deposition substrate 42, which is typically a silicon wafer at an intermediate stage of device formation, is typically placed on a susceptor 46 which maintains a constant temperature during deposition. The susceptor 46 may be heated by, for example, an infrared light source 48. In particularly preferred embodiments of the present invention, the substrate temperature is maintained at a sufficiently low temperature so that silicon atoms at the surface have relatively low levels of mobility. As discussed above, for HSG-Si deposition in accordance with a preferred embodiment of the present invention, there is no need to maintain the deposition substrate at a sufficiently high temperature to cause thermal nucleation at the surface of the silicon surface of the deposition substrate. Temperatures ranging between 200°–500° C. were utilized in the inventors' experiments in growing HSG-Si layers having desired levels of surface texture.

The relative concentrations of the reaction gases appeared to have the greatest effect on the texture of the HSG-Si deposited in accordance with preferred embodiments of the present invention. Silicon atoms should be provided to the surface of the deposition substrate at a proper rate so that little surface reconstruction occurs, allowing the surface texture to develop during deposition. Too high of a reactant concentration (ie., too little hydrogen gas input to the system) results in the deposition of an amorphous film. In the illustrated embodiment using a particular configuration of an ECR-CVD system, the dilution ratio $H_2/(SiH_4+H_2)$ is preferably maintained in the range from 70–99%.

Often, HSG-Si layers are used on the surface of electrodes that are coated with a thin layer of dielectric material and a layer of conductive material, where the HSG-Si electrode layer is capacitively coupled to the conductive layer. It is typically desirable for such electrodes incorporating a layer of HSG-Si to be highly conductive. To this end, the HSG-Si layer can be doped by ion implantation, diffusion, or by in situ doping during the plasma deposition. In situ doping during plasma deposition is particularly preferred because of the ease by which dopants may be incorporated into a layer of HSG-Si during plasma deposition. In addition, by in situ doping the HSG-Si layer, the exposed surface of the HSG-Si need not be exposed to further heat treatments to anneal an implantation or to drive a diffusion process. Such heat treatments represent additional processing steps and so are desirably avoided to reduce costs. In situ doping may be accomplished, for example, by introducing borane, diborane, arsine or phosphine into the downstream gas inlet of the ECR-CVD system illustrated in FIG. 4 during the deposition of the HSG-Si layer. The ease with which in situ doping can be accomplished in plasma deposited HSG-Si stands in contrast to HSG-Si, which appears difficult to dope in situ.

Figure 5:
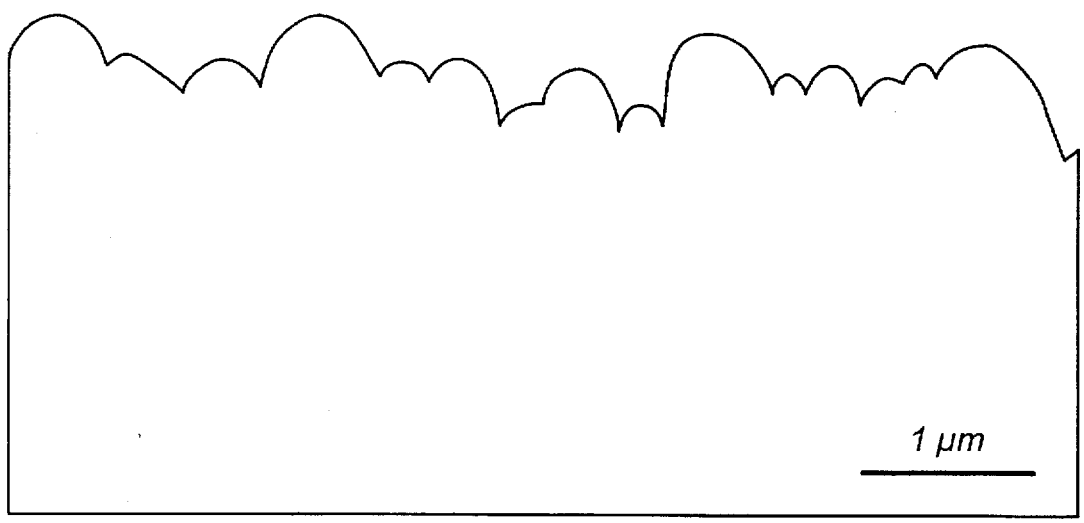
FIG. 5 is a cross-sectional photomicrograph of a textured polysilicon layer formed in accordance with the present invention.

FIG. 5 is a cross-sectional view of HSG-Si deposited in accordance with the present invention. The illustrated HSG-Si layer was deposited on the cleaned surface of a layer of polysilicon. The layer of HSG-Si was deposited at a total gas pressure 10 mTorr, a dilution ratio $H_2/(SiH_4+H_2)=98\%$, a substrate temperature of 300° C. and 100 W of input microwave power. It is apparent from the FIG. 5 micrograph that a substantial level of texture has been introduced during the deposition of this layer of HSG-Si, with surface structures on the order of one hundred nanometers being formed in the deposition process. When the surface of a structure such as that illustrated in FIG. 5 is coated with a thin dielectric layer and an upper layer of conductive material is deposited on the dielectric layer, a high capacitive coupling can be established between the HSG-Si layer and the upper layer of conductive material. For such a structure, it is desirable to use a dielectric layer that is thin in comparison to the scale of the texture on the surface. For the layer illustrated in FIG. 5, which has surface structures approaching one micron in size, it would be desirable to use a dielectric layer that is less than about eight nanometers thick. It is also desirable to form the dielectric layer from a material having a high dielectric constant. An appropriate dielectric layer can be formed by depositing a layer of silicon nitride on the surface of the HSG-Si layer, for example by CVD, and then growing a thin oxide layer on the surface of the silicon nitride layer. Often, such an "NO" layer is formed on top of an oxide layer, such as a native oxide layer, covering the surface of the HSG-Si layer, so that the actual dielectric film formed has an "ONO" structure. According to Rosato, et al., "Ultra-High Capacitance Nitride Films Utilizing Surface Passivation on Rugged Polysilicon," *J. Electrochem. Soc.*, Vol. 139, No. 12, pages 3678–82 (Dec. 1992), such an "ONO" structure can be formed to a thickness of as little as approximately 4 nanometers. The teachings of the Rosato article, including the teachings regarding the formation of ONO dielectric layers on rugged polysilicon and on the passivation of native oxide surfaces before the deposition of a CVD nitride layer, are hereby incorporated by reference. Other high dielectric constant materials such as $Ta_2O_5$ might also be used as the dielectric layer over the HSG-Si layer.

Figure 6:
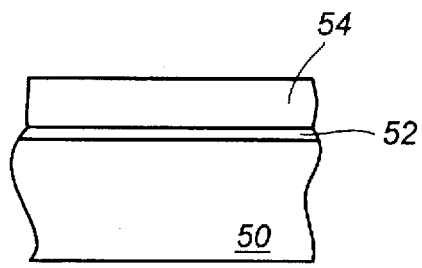
FIGS. 6–8 illustrate the formation of a flash memory cell formed using aspects of the present invention.
Figure 7:
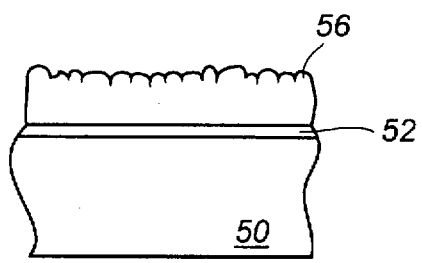
Figure 8:
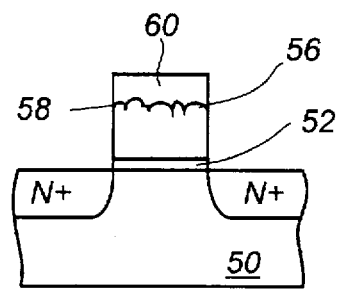

While the method for depositing HSG-Si has been described herein with specific reference to forming a capacitor such as that shown in the DRAM structure of FIG. 1, HSG-Si deposited in accordance with the present invention can be utilized in other structures. For example, HSG-Si can be used on the surface of the floating gate in an EEPROM or a flash memory. Use of an HSG-Si surface and a thin ONO or other dielectric layer between a polysilicon floating gate and a polycide control gate formed over the dielectric layer greatly improves the coupling between the floating gate and the control gate as compared to more conventional flash memory device structures. FIGS. 6–8 illustrate the formation of such a structure.

Referring to FIG. 6, a flash memory may be formed on a P-type silicon substrate 50 by first growing a thin thermal gate oxide 52 and then depositing a thin layer of polysilicon 54. Depending on the particular sequence and timing of the layer formation, the surface of the polysilicon may be coated with a thin layer of thermal oxide, which is preferably removed before HSG-Si is grown on the polysilicon layer 54. The thermal oxide may be removed, for example, by hydrogen fluoride (HF) vapor, $H_2$ plasma or spin-etching using a solution of HF, ethanol ($C_2H_5OH$) and deionized water ($H_2O$). The surface of the FIG. 6 deposition substrate will have its thermal oxide layer removed, and the surface of the exposed polysilicon layer 54 will be hydrogenated to protect the surface from the immediate formation of another native oxide layer. A layer of HSG-Si is then deposited, preferably in an ECR-CVD system such as that illustrated in FIG. 4, producing the polysilicon and HSG-Si layer structure 56 illustrated in FIG. 7. Preferably, at least the HSG-Si surface layer is doped by in situ doping during the plasma deposition process. A layer of CVD silicon nitride is then deposited on the surface of layer 56 and the nitride is oxidized to produce NO or ONO dielectric layer 58. A conductive layer 60 of, for example, polycide is formed on the dielectric layer 58, the gate electrode is patterned and defined by etching, and source and drain regions are formed by doping to form the partial structure illustrated in FIG. 8. Further processing is performed to complete the flash memory device.

While the present invention has been described with reference to certain preferred embodiments thereof, it is to be understood that the present invention is not limited to a particular preferred embodiment described herein. Rather, the scope of the present invention is to be determined from the following claims.

What is claimed:

1. A method of making a device comprising the steps of:
providing to a deposition system a substrate having an exposed surface of a conductor primarily comprising silicon;

generating a plasma region within the deposition system;
providing at least one reactant gas comprising silicon to the deposition system so that ions comprising silicon are generated within the deposition system and are transported to the exposed surface; and
depositing a layer of HSG-Si on the exposed surface of the conductor primarily comprising silicon.

2. The method of claim 1, wherein the deposition system is an electron cyclotron resonance chemical vapor deposition system having a gas flow path extending from a first gas inlet through a reactant gas excitation region to a deposition system gas output coupled to a pumping system.

3. The method of claim 2, wherein the substrate is positioned downstream along the gas flow path from the reactant gas excitation region.

4. The method of claim 3, wherein the deposition system includes a second gas inlet along the gas flow path between the plasma region and the substrate.

5. The method of claim 4, wherein silane is introduced to the deposition system at the second gas inlet during the step of depositing a layer of HSG-Si.

6. The method of claim 5, further comprising the step of providing hydrogen gas to the deposition system at the first gas inlet so that the hydrogen gas is ionized within the plasma region.

7. The method of claim 6, wherein the hydrogen and silane gases are provided to the deposition system so that a dilution ratio of the silane and hydrogen gas mixture $H_2/(SiH_4+H_2)$ is between 70–99%.

8. The method of claim 1, wherein the layer of HSG-Si is doped in situ by introducing a second reactant gas comprising a dopant species to the deposition system so that ions comprising the dopant species are generated within the deposition system and are transported to the exposed surface.

9. The method of claim 8, wherein the exposed surface is cleaned using hydrogen fluoride.

10. A method of making a device comprising the steps of:
depositing a layer of polysilicon on or above a silicon substrate;
providing an exposed surface on the layer of polysilicon substantially free of native oxides;
providing the silicon substrate to a deposition system;
maintaining the silicon substrate at a temperature below about 590° C.;
providing at least one reactant gas comprising silicon to the deposition system;
generating a plasma within the deposition system so that the at least one reactant gas is excited to provide ions comprising silicon to the deposition system; and
transporting the ions comprising silicon to the exposed surface of the layer of polysilicon and depositing a layer of HSG-Si.

11. The method of claim 10, wherein the exposed surface is hydrogenated before the silicon substrate is provided to the deposition system.

12. The method of claim 10, wherein the silicon substrate is maintained at a temperature between about 200°–500° C.

13. The method of claim 10, wherein the deposition system is operated at a total pressure of between about 5–60 mTorr.

14. The method of claim 10, further comprising the step of forming a dielectric layer of less than eight nanometers in thickness on the surface of the HSG-Si layer.

15. The method of claim 10, further comprising the step of depositing a layer of silicon nitride over the surface of the HSG-Si layer.

16. The method of claim 15, further comprising the steps of forming an oxide on the silicon nitride layer and then forming a layer of a conductive material over the oxide layer.

17. The method of claim 16, wherein the layer of silicon nitride is deposited on a native oxide layer formed on the surface of the HSG-Si layer.

18. The method of claim 10, wherein the reactant gases in the deposition system comprise silane and hydrogen.

19. The method of claim 18, wherein the hydrogen and silane gases are provided to the deposition system so that a dilution ratio of silane within the silane and hydrogen gas mixture $H_2/(SiH_4+H_2)$ is between 70–99%.

20. The method of claim 18, wherein the reactant gases further comprise a dopant gas.

21. The method of claim 16, wherein the conductive layer comprises polysilicon.

22. A method of making a device comprising the steps of:

depositing a layer of polysilicon on or above a silicon substrate;

providing an exposed surface on the layer of polysilicon substantially free of native oxides;

providing the silicon substrate to a deposition system;

providing at least one reactant gas comprising silicon to the deposition system;

generating a plasma within the deposition system so that the at least one reactant gas is excited to provide ions comprising silicon to the deposition system; and transporting the ions comprising silicon to the exposed surface of the layer of polysilicon and depositing a layer of HSG-Si.

* * * * *